United States Patent
Tian et al.

(10) Patent No.: US 12,046,320 B2
(45) Date of Patent: Jul. 23, 2024

(54) CIRCUIT FOR CONTROLLING CALIBRATION, ELECTRONIC DEVICE, AND METHOD FOR CONTROLLING CALIBRATION

(71) Applicant: CHANGXIN MEMORY TECHNOLOGIES, INC., Hefei (CN)

(72) Inventors: Kai Tian, Hefei (CN); Enpeng Gao, Hefei (CN); Zengquan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 116 days.

(21) Appl. No.: 17/871,785

(22) Filed: Jul. 22, 2022

(65) Prior Publication Data

US 2023/0352065 A1    Nov. 2, 2023

Related U.S. Application Data

(63) Continuation of application No. PCT/CN2022/092956, filed on May 16, 2022.

(30) Foreign Application Priority Data

Apr. 29, 2022  (CN) .......................... 202210473826.4

(51) Int. Cl.
*G11C 7/10*    (2006.01)
*G11C 11/4093*    (2006.01)

(52) U.S. Cl.
CPC ........ *G11C 7/1048* (2013.01); *G11C 11/4093* (2013.01)

(58) Field of Classification Search
CPC . G11C 7/1048; G11C 11/4093; G11C 7/1057; G11C 29/028; G11C 29/50008;
(Continued)

(56) References Cited

U.S. PATENT DOCUMENTS

| 6,889,334 B1 | 5/2005 | Magro |
| 8,238,180 B2 | 8/2012 | Jung |

(Continued)

FOREIGN PATENT DOCUMENTS

| CN | 101686051 A | 3/2010 |
| CN | 106486155 A | 3/2017 |

(Continued)

*Primary Examiner* — Jung Kim
(74) *Attorney, Agent, or Firm* — Kilpatrick Townsend & Stockton LLP

(57) ABSTRACT

A calibration control circuit includes an off-chip calibration circuit, an on-chip calibration circuit and a mode switching circuit. The off-chip calibration circuit is configured to receive and store a first calibration code sent by a user. The on-chip calibration circuit is configured to receive an enable signal and perform a ZQ self-calibration process on the memory to obtain a second calibration code adapted to a current environmental parameter when the enable signal is in an active state. The mode switching circuit is configured to receive a calibration mode signal, the first calibration code and the second calibration code, and determine the first calibration code as a ZQ calibration code when the calibration mode signal indicates an off-chip calibration mode, or, determine the second calibration code as the ZQ calibration code when the calibration mode signal indicates an on-chip calibration mode.

20 Claims, 5 Drawing Sheets

(58) Field of Classification Search
CPC .......... B60K 17/08; B60K 1/02; B60K 17/04; B60L 15/007; B60Y 2200/91; Y02T 10/64

See application file for complete search history.

(56) References Cited

U.S. PATENT DOCUMENTS

| | | | |
|---|---|---|---|
| 9,043,539 | B2 | 5/2015 | Kaiwa |
| 9,935,632 | B1 | 4/2018 | Gans |
| 10,090,836 | B1 | 10/2018 | Gans |
| 10,439,612 | B1 | 10/2019 | Johnson |
| 10,747,245 | B1 | 8/2020 | He |
| 11,062,744 | B2 | 7/2021 | Lee |
| 11,145,383 | B1 | 10/2021 | Lee |
| 2007/0073506 | A1 | 3/2007 | Boskovic |
| 2008/0304336 | A1 | 12/2008 | Kim |
| 2010/0077268 | A1 | 3/2010 | Lee |
| 2011/0066798 | A1 | 3/2011 | Kaiwa |
| 2011/0267911 | A1 | 11/2011 | Jung |
| 2017/0062050 | A1 | 3/2017 | Baek et al. |
| 2019/0028102 | A1 | 1/2019 | Gans |
| 2019/0362763 | A1* | 11/2019 | Lee .................. G11C 29/022 |
| 2020/0059232 | A1 | 2/2020 | Johnson |
| 2021/0149423 | A1* | 5/2021 | He .................. G11C 7/1057 |
| 2021/0383844 | A1 | 12/2021 | Antonyan |
| 2021/0391028 | A1 | 12/2021 | Lee |

FOREIGN PATENT DOCUMENTS

| | | |
|---|---|---|
| CN | 110534140 A | 12/2019 |
| CN | 111161783 A | 5/2020 |
| CN | 111933205 A | 11/2020 |
| CN | 112204665 A | 1/2021 |
| CN | 112669894 A | 4/2021 |
| CN | 112908398 A | 6/2021 |
| CN | 113421598 A | 9/2021 |
| CN | 113539344 A | 10/2021 |
| KR | 20080107760 A | 12/2008 |

* cited by examiner

CIRCUIT FOR CONTROLLING CALIBRATION, ELECTRONIC DEVICE, AND METHOD FOR CONTROLLING CALIBRATION

CROSS-REFERENCE TO RELATED APPLICATIONS

This application is a continuation of International Patent Application No. PCT/CN2022/092956, filed on May 16, 2022, which claims priority to Chinese patent application No. 202210473826.4, filed on Apr. 29, 2022, The disclosures of the above mentioned patent applications are hereby incorporated by reference in their entirety.

BACKGROUND

In a Dynamic Random Access Memory (DRAM), there are an output drive circuit and a termination resistance circuit, which are used to implement the signal transmission process. During the working process of the DRAM, it is necessary to calibrate the relevant resistance values of the output drive circuit and the termination resistance circuit to match the actual working conditions (such as voltage and temperature), which is called ZQ calibration. However, a certain amount of power consumption and system time is occupied by ZQ calibration, and the performance of the memory is reduced.

SUMMARY

The present disclosure relates to the technical field of semiconductor memory, and in particular, to a circuit for controlling calibration, an electronic device and a method for controlling calibration.

The present disclosure provides a circuit for controlling calibration, an electronic device and a method for controlling calibration, which can reduce the power consumption of the ZQ calibration process and save the resources of the memory.

The technical solutions of the present disclosure are implemented as follows.

In a first aspect, the embodiments of the present disclosure provide a circuit for controlling calibration. The circuit is applicable for a memory. The circuit includes an off-chip calibration circuit, an on-chip calibration circuit and a mode switching circuit.

The off-chip calibration circuit is configured to receive and store a first calibration code sent by a user.

The on-chip calibration circuit is configured to receive an enable signal, and perform a ZQ self-calibration process on the memory to obtain a second calibration code adapted to a current environmental parameter in a case that the enable signal is in an active state.

The mode switching circuit is configured to receive a calibration mode signal, the first calibration code and the second calibration code, and determine the first calibration code as a ZQ calibration code in the case that the calibration mode signal indicates an off-chip calibration mode, or, determine the second calibration code as the ZQ calibration code in a case that the calibration mode signal indicates an on-chip calibration mode.

In a second aspect, the embodiments of the present disclosure provide an electronic device. The electronic device includes a memory, and the memory includes the circuit for controlling calibration described in the first aspect.

In a third aspect, the embodiments of the present disclosure provide a method for controlling calibration. The method is applicable for an electronic device including a memory. The method includes the following operations.

A calibration mode signal is received.

A first calibration code sent by a user is determined as a ZQ calibration code in a case that the calibration mode signal indicates the off-chip calibration mode.

Optionally, in a case that the calibration mode signal indicates the on-chip calibration mode, the memory is controlled to perform a ZQ self-calibration process to obtain a second calibration code adapted to a current environmental parameter, and the second calibration code is determined as the ZQ calibration code.

DETAILED DESCRIPTION

Figure 1:
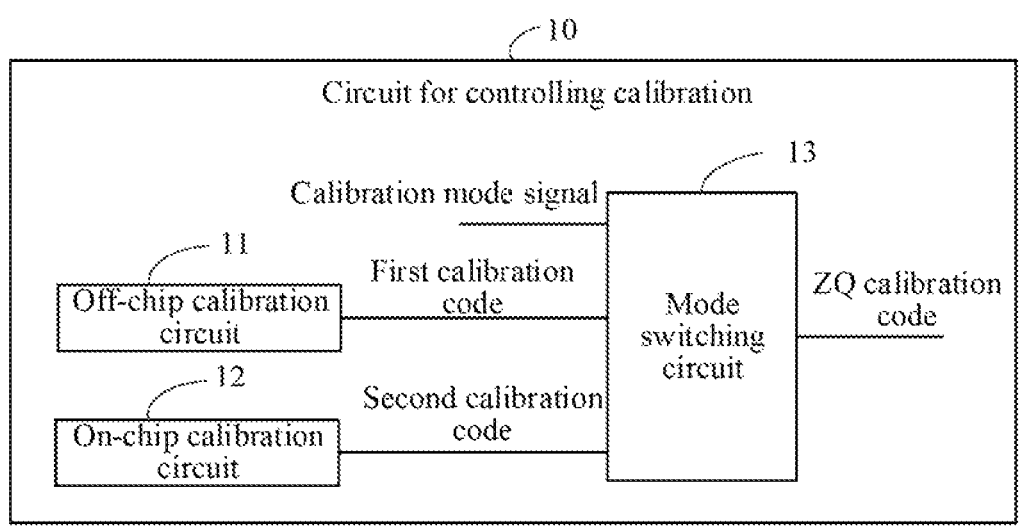
FIG. 1 is a schematic structural diagram of a circuit of controlling calibration provided by some embodiments of the present disclosure.

The technical solutions in the embodiments of the present disclosure will be clearly and completely described below with reference to the accompanying drawings in the embodiments of the present disclosure. It should be understood that the specific embodiments described herein are only used to explain the related disclosure, but not to limit the disclosure. In addition, it should be noted that, for the convenience of description, only the parts related to the relevant disclosure are shown in the drawings.

Unless otherwise defined, all technical and scientific terms used herein have the same meaning as commonly understood by one of ordinary skill in the art to which the present disclosure belongs. The terminology used herein is for the purpose of describing the embodiments of the present disclosure only and is not intended to limit the present disclosure.

In the following description, reference is made to "some embodiments" which describe a subset of all possible embodiments, but it is understood that "some embodiments" may be the same or a different subset of al possible embodiments, and may be combined with each other without conflict.

It should be noted that the term "first\second\third" involved in the embodiments of the present disclosure is only used to distinguish similar objects, and does not represent a specific ordering of objects. It may be understood that the "first\second\third" may be interchanged with a specific order or order of precedence if permitted, so that the embodiments of the present disclosure described herein can be implemented in an order to other than those illustrated or described herein.

The following are the explanations of the professional terms involved in the embodiments of the present disclosure and the corresponding relationship of some nouns.
Low Power Double Data Rate SDRAM (LPDDR)
Joint Electron Device Engineering Council (JEDEC)

With the development of technologies, the data processing frequency of a memory (such as LPDDR) is getting higher and higher, and maintaining signal integrity during data transmission is a very important task. For example, the LPDDR has a ZQ pin (BALL), and the ZQ pin is connected to a reference resistance of 240 ohms externally to calibrate the output impedance of the data signal DQ and the termination impedance of the command address signal CA, so as to implement impedance matching during signal transmission. The above impedance calibration process is also called as ZQ calibration.

At present, in the working process of the LPDDR, ZQ self-calibration process needs to be performed frequently according to the external conditions where the memory is located. However, if the external conditions are constant, for example, the voltage and temperature are constant, the ZQ calibration code obtained by the same chip after each ZQ calibration is the same roughly, or the lowest bit of the ZQ calibration code is slightly changed by the effect of noise, but it is also within the error range. However, a part of power consumption will be consumed by each ZQ self-calibration process, and a certain calibration time will be taken up, which results in a waste of memory resources. In addition, if the voltage noise of the system is large, the ZQ calibration code may be affected by the voltage noise and a large deviation may be introduced. Correspondingly, the signal integrity of the memory will be degraded due to impedance mismatch.

Based on this, the embodiments of the present disclosure provide a circuit for controlling calibration, which allows a user to select an on-chip calibration mode or an off-chip calibration mode to determine the ZQ calibration code, so as to implement the best performance in different practical application scenarios. In a case that the external conditions remain unchanged, the user may set the ZQ calibration code through the off-chip calibration mode, and the frequent ZQ self-calibration process is not needed, which not only reduces power consumption but also saves system time, thereby reducing resource waste and improving data process performance of memory. In addition, the deviation introduced by environmental noise to the ZQ calibration code and the degradation of signal integrity of the memory due to impedance mismatch can be avoided through the off-chip calibration mode.

The embodiments of the present disclosure will be described in detail below with reference to the accompanying drawings.

In an embodiment of the present disclosure, referring to FIG. 1, a schematic structural diagram of a circuit for controlling calibration 10 provided by some embodiments of the present disclosure is shown. As shown in FIG. 1, the circuit for controlling calibration 10 includes an off-chip calibration circuit 11, an on-chip calibration circuit 12 and a mode switching circuit 13.

The off-chip calibration circuit 11 is configured to receive and store a first calibration code sent by a user.

The on-chip calibration circuit 12 is configured to receive an enable signal and perform a ZQ self-calibration process on the memory to obtain a second calibration code adapted to a current environmental parameter in a case that the enable signal is in an active state.

The mode switching circuit 13 is configured to receive a calibration mode signal, the first calibration code and the second calibration code, and determine the first calibration code as a ZQ calibration code in the case that the calibration mode signal indicates an off-chip calibration mode, or, determine the second calibration code as the ZQ calibration code in a case that the calibration mode signal indicates an on-chip calibration mode.

It should be noted that the calibration control circuit 10 in the embodiments of the present disclosure is applicable for various types of memories. For example, the memory may be LPDDR4, LPDDR5, DDR4, DDR5, etc.

In the embodiments of the present disclosure, two different modes are provided by the memory to implement ZQ calibration, i.e., an off-chip calibration mode and an on-chip calibration mode. In the off-chip calibration mode, the user may set the ZQ calibration code directly. In the on-chip calibration mode, the ZQ calibration code is obtained by performing ZQ self-calibration process on the memory. It should be understood that the ZQ calibration code is subsequently used to be written into the input impedance circuit and the termination resistance circuit, so as to calibrate the output impedance of the data signal DQ and the termination impedance of the command address signal CA to expected values.

Here, the on-chip calibration circuit 12 is connected to a standard resistance (resistance value is 240 ohms) externally, and the on-chip calibration circuit 12 can perform ZQ self-calibration process based on the standard resistance, and calibrate the output impedance and termination impedance of the memory to the standard resistance value. The ZQ self-calibration process refers to the on-chip ZQ calibration that is automatically performed under the condition limitations of certain changes in temperature, voltage, and time. For details, the reference is made to the relevant regulations of JEDEC. Elaborations are omitted herein.

In this way, in the embodiments of the present disclosure, the user is allowed to select the on-chip calibration mode or the off-chip calibration mode to determine the ZQ calibration code, so as to implement the best performance in different practical application scenarios. In a case that the external conditions remain unchanged, the user may set the ZQ calibration code through the off-chip calibration mode directly, and the frequent ZQ self-calibration process is not needed, which not only reduces power consumption but also saves system time, thereby reducing resource waste and improving data process performance of memory. In addition, the deviation introduced by environmental noise to the ZQ calibration code and the degradation of signal integrity of the memory due to impedance mismatch can be avoided through the off-chip calibration mode.

Figure 2:
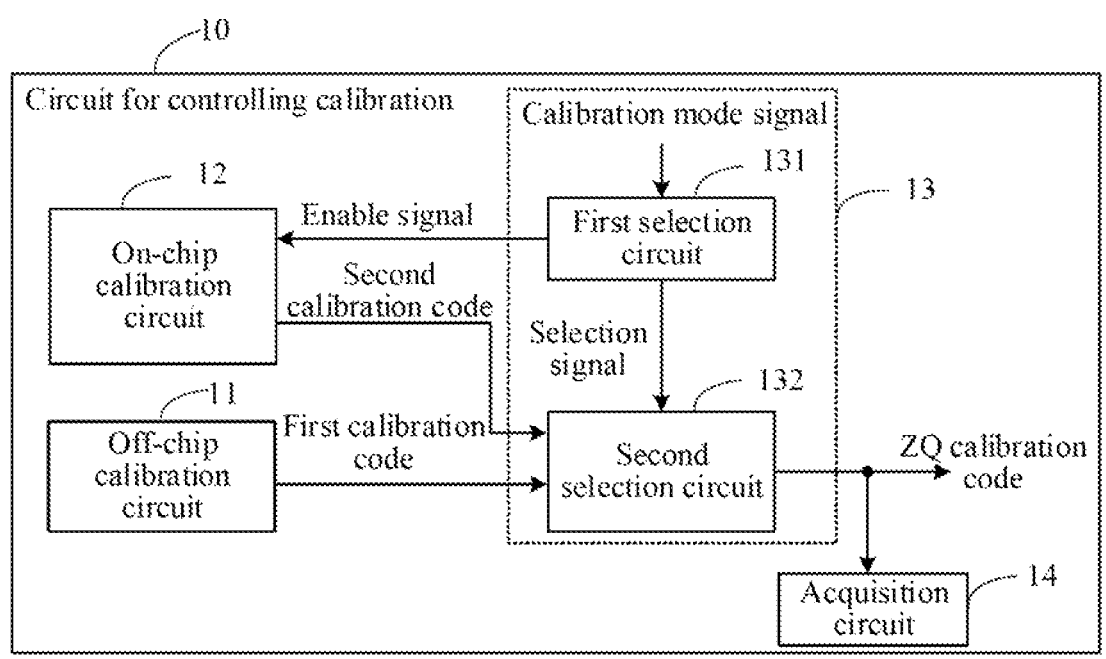
FIG. 2 is a schematic structural diagram of another circuit of controlling calibration provided by some embodiments of the present disclosure.

As shown in FIG. 2, in some embodiments, the mode switching circuit 13 may include a first selection circuit 131 and a second selection circuit 132.

The first selection circuit 131 is configured to receive the calibration mode signal, and output a selection signal in a first state in a case that the calibration mode signal indicates the off-chip calibration mode, or, output a selection signal in a second state in a case that the calibration mode signal indicates the on-chip calibration mode.

The second selection circuit 132 is configured to receive the selection signal, and output the first calibration code as the ZQ calibration code in a case that the selection signal is in the first state, or, output the second calibration code as the ZQ calibration code in a case that the selection signal is in the second state.

In some embodiments, the first selection circuit 131 is further configured to output the enable signal in the active state to the on-chip calibration circuit in a case that the calibration mode signal indicates the on-chip calibration mode, or, output the enable signal in an inactive state to the on-chip calibration circuit in a case that the calibration mode signal indicates the off-chip calibration mode.

It should be understood that the first state and the second state refer to different logic level states, but their specific values may be determined according to practical application scenarios. For example, the first state may be a high-level signal, and the second state may be a low-level signal. Optionally, the first state may be a low-level signal, and the second state may be a high-level signal. Similarly, the active state and the inactive state refer to different logic level states, and their specific values may also be determined according to practical application scenarios, which are not limited in the embodiments of the present disclosure.

In this way, in the on-chip calibration mode, the enable signal is in an active state, so to that the on-chip calibration circuit 12 performs ZQ self-calibration process on the memory, and a ZQ calibration code adapted to the current environmental parameters can be obtained, the ZQ calibration process without the user's perception is implemented. In the off-chip calibration mode, the enable signal is in an inactive state, the on-chip calibration circuit 12 stops to perform the ZQ self-calibration process, which can reduce power consumption, save system time, and avoid introducing environmental noise.

Figure 3:
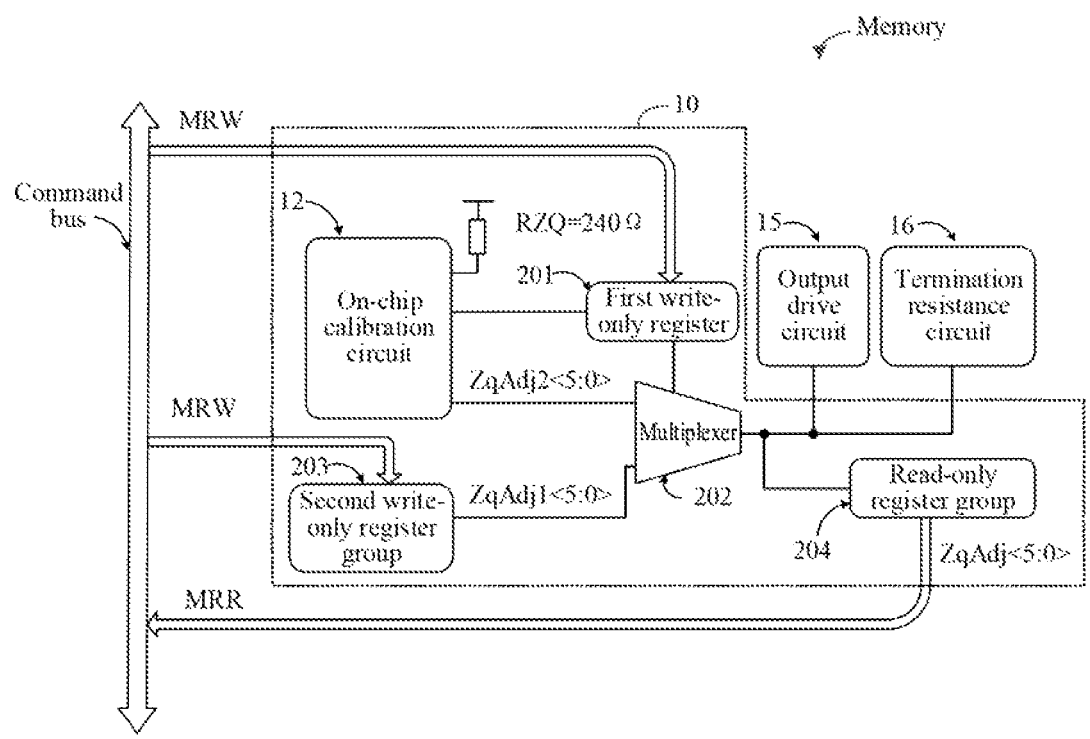
FIG. 3 is a schematic diagram of an application scenario of the circuit of controlling calibration provided by some embodiments of the present disclosure.

Referring to FIG. 3, a schematic diagram of an application scenario of a circuit for controlling calibration 10 provided by the embodiments of the present disclosure is shown. It may be seen from FIG. 2 and FIG. 3 that, in some embodiments, the first selection circuit 131 includes a first write-only register 201, the second selection circuit 132 includes a multiplexer 202, and the off-chip calibration circuit 11 includes a second write-only register group 203.

An input end of the first write-only register 201 is used for receiving the calibration mode signal, and an input end of the second write-only register group 203 is used for receiving the first calibration code.

An enable end of the on-chip calibration circuit 12 is connected to a first output end of the first write-only register 201 to receive the enable signal.

A control end of the multiplexer 202 is connected to a second output end of the first write-only register 201 and is configured to receive the selection signal. The first input end of the multiplexer 202 is connected to an output end of the on-chip calibration circuit 12 and is configured to receive the second calibration code ZqAdj2<5:0>. A second input end of the multiplexer 202 is connected to an output end of the second write-only register group 203 and is configured to receive the first calibration code ZqAdj1<5:0>. The output end of the multiplexer 202 is used for outputting the ZQ calibration code ZqAdj<5:0>.

It should be noted that the first write-only register 201 may store only one bit of data, to and different numerical states (0 or 1) of the data indicate the on-chip calibration mode or the off-chip calibration mode respectively, which depends on the practical application scenario. The second write-only register group 203 needs to store multiple bits of data, which are depended on the number of bits of the ZQ calibration code. Exemplarily, the ZQ calibration code may include 6-bit data, represented as <5:0>.

The input end of the first write-only register 201 and the input end of the second write-only register group 203 are both connected to a Command Bus, so as to implement related data transmission. Specifically, the user sends the calibration mode signal to the first write-only register 201 in the manner of the write command MRW (Mode Register Write), so that the on-chip calibration mode or the off-chip calibration mode is started. The user sends the first calibration code to the second write-only register group 203 in the manner of the write command MRW, and the first calibration code is used for setting the ZQ calibration code subsequently.

It should be understood that before switching from the on-chip calibration mode to the off-chip calibration mode, the user should send the first calibration code firstly to avoid a blank interval in the ZQ calibration code after switching from the on-chip calibration mode to the off-chip calibration mode. That is to say, if the user directly switches the on-chip calibration mode to the off-chip calibration mode without sending the first calibration code firstly, there may be no data in the second write-only register group 203 at this time or there may be inappropriate data (for example, data in off-chip calibration mode in the last time) in the second write-only register group 203 at this time, which result in a signal error due to the impedance mismatch of the memory.

It should be noted that, the circuit structure shown in FIG. 3 is not the only choice due to the diversity of circuit elements. Exemplarily, the first write-only register 201 may have only one output end. If the inactive state of the enable signal is the same as the first state of the calibration mode signal, both the input end of the first write-only register 201 and the enable end of the on-chip calibration circuit 12 may be connected to the only output end of the first write-only register 201. If the inactive state of the enable signal is different from the first state of the calibration mode signal, the related logic may be implemented with the help of an inverter.

In some embodiments, as shown in FIG. 2, the circuit for controlling calibration 10 further includes an acquisition circuit 14, and an input end of the acquisition circuit 14 is connected to an output end of the mode switching circuit 13.

The on-chip calibration circuit 12 is further configured to perform the ZQ self-calibration process on the memory for multiple times for multiple environmental parameters in a test mode, to obtain multiple candidate calibration codes.

The mode switching circuit 13 is further configured to receive the calibration mode signal indicating an on-chip calibration mode in the test mode, to output the multiple candidate calibration codes.

The acquisition circuit 14 is configured to acquire the multiple candidate calibration codes to establish a preset mapping relationship. The preset napping relationship indicates relationships between the multiple environmental parameters and the multiple candidate calibration codes.

Here, during the working process of the memory, the user selects and obtains the first calibration code from the multiple candidate calibration codes based on the preset mapping relationship and a current environment parameter of the memory.

It should be noted that, in the embodiments of the present disclosure, the result output of the ZQ self-calibration process is implemented through the acquisition circuit 14, so that the user may know the relevant value of the ZQ calibration code.

Specifically, in the test mode, the calibration mode signal indicates the on-chip calibration mode fixedly, so that self-calibration process is performed on the memory under different environmental parameters, multiple candidate calibration codes are obtained, and a preset mapping relationship is established. Here, the environmental parameter is used for indicating the external environment in which the memory is located. Exemplarily, each environmental parameter may include a voltage parameter to and/or a temperature parameter.

It should be noted that, in the case where each environmental parameter includes the voltage parameter and the temperature parameters, taking a system composed of a memory and a memory controller as an example, the test mode may be entered in a fixed stage of system initialization, and the temperature and voltage of the memory are adjusted through the memory controller, then the memory is controlled to perform ZQ self-calibration process, and the calibration result is output through the acquisition circuit 14, and the candidate calibration code corresponding to the environmental parameter (temperature parameter and voltage parameter) is obtained. The above process is repeated under different temperatures and voltages, candidate calibration codes corresponding to different environmental parameters may be obtained, and a preset mapping relationship is also established. In addition, the system may also include a temperature control device, after entering the test mode, the voltage of the memory is adjusted by the memory controller, and the temperature of the memory is adjusted by the temperature control device.

In this way, during the working process of the memory, the user may determine the corresponding first calibration code by using the current environment parameter and the preset mapping relationship, and the accuracy of the ZQ calibration may be guaranteed even in the off-chip calibration mode.

In some embodiments, it may be seen from the combination of the FIG. 2 and FIG. 3 that the acquisition circuit 14 includes a read-only register group 204, and the input end of the read-only register group 204 is connected to the output end of the multiplexer 202.

The read-only register group 204 is configured to acquire am output signal of the multiplexer 202.

The read-only register group 204 is further configured to receive, in the test mode and after the on-chip calibration circuit performs one time of the ZQ self-calibration process, a read command; and output a corresponding candidate calibration code according to the read command.

It should be noted that the read-only register group 204 needs to store multiple bits of data, which depends on the number of bits of the ZQ calibration code. That is to say, the number of bits of data stored in the second write-only register group 203 is the same with the number of bits of data stored in the read-only register group 204. In addition, the input end of the read-only register group 204 and the output end of the read-only register group 204 are also connected to the Command Bus. After the read command MRR (Mode Register Read) is received by the read-only register group 204 from the Command Bus, the candidate calibration code is output.

In this way, the calibration result of the on-chip calibration circuit 12 may be output by means of the read-only register group 204, so that the user may know the ZQ calibration codes corresponding to different environmental parameters to determine an appropriate first calibration code.

In some embodiments, as shown in FIG. 3, the memory further includes an output drive circuit 15 and a termination resistance circuit 16. The memory is further configured to write the ZQ calibration code into the output drive circuit 15 and the termination resistance circuit 16 to implement a resistance value calibration process of the output drive circuit 15 and the termination resistance circuit 16.

It may be seen from the above that firstly, in the embodiment of the present disclosure, two register groups are added, which are the second write-only register group 203 and the read-only register group 204 respectively. The user sends the write command MRW to write the first calibration code into the second write-only register sets 203, and the user sends the read command MRR to read out the candidate calibration code from the read-only register set 204. Secondly, in the embodiments of the present disclosure, the first write-only register 201 (which may also be a programmable fuse Efuse register which is fixed before leaving the factory) is added, the user writes the calibration mode signal into the first write-only register 201 through write command MRW, and whether the ZQ calibration code is output by the on-chip calibration circuit 12 or output by the off-chip calibration circuit 11 is controlled. In this way, a control circuit for dual-selection of on-chip and off-chip ZQ calibration is implemented.

In a specific embodiment, it is assumed that the environmental parameter includes a temperature parameter and a voltage parameter, taking a system composed of a memory controller and a memory as an example, the working process of the above circuit for controlling calibration 10 will be specifically described.

Firstly, when the system is initialized, the memory controller controls the memory to enter the test mode, and the calibration mode signal indicates the on-chip calibration mode at this time. The combination of temperature and voltage is scanned by the memory controller, one case of the combination is scanned for each time, and an on-chip ZQ self-calibration process is performed once by using the on-chip calibration circuit 12. After the ZQ self-calibration process is completed, the value of the candidate calibration code is read out through the read-only register group 204, and these values are recorded by the user's System on Chip (SOC). After scanning all combinations, the user will obtain a comparison table of temperature parameters, voltage parameters and candidate calibration codes, details is shown in the following Table 1.

TABLE 1

| | Voltage parameter = 0.4 V | Voltage parameter = 0.45 V | Voltage parameter = 0.5 V | Voltage parameter = 0.55 V | Voltage parameter = 0.60 V |
|---|---|---|---|---|---|
| Temperature parameter = −40° C. | 001110 | 000110 | 000010 | 000001 | 000000 |
| Temperature parameter = 0° C. | 010100 | 001100 | 001000 | 000101 | 000100 |
| Temperature parameter = 25° C. | 101100 | 100100 | 100000 | 010110 | 010100 |
| Temperature parameter = 85° C. | 110100 | 101100 | 101000 | 100010 | 100000 |

TABLE 1-continued

|  | Voltage parameter = 0.4 V | Voltage parameter = 0.45 V | Voltage parameter = 0.5 V | Voltage parameter = 0.55 V | Voltage parameter = 0.60 V |
|---|---|---|---|---|---|
| Temperature parameter = 105° C. | 111100 | 110100 | 110000 | 100100 | 100000 |
| Temperature parameter = 125° C. | 111111 | 111100 | 111000 | 110100 | 100100 |

It should be understood that the values of the various parameters and calibration codes in Table 1 are examples and do not constitute relevant limitations. In addition, the temperature parameter refers to the current temperature for the memory, and the voltage parameter refers to the power supply voltage used by the output drive circuit and the termination circuit the memory.

Secondly, during the working process of the system, the current voltage parameter is determined by a Power Management Unit (PMU) in the system, and the current temperature parameter is determined by a Temper Sensor. The first calibration code may be determined from Table 1 based on the current voltage parameter and the current temperature parameter. After writing the first calibration code into the second write-only register group 203, the memory is controlled to switch to the off-chip calibration mode by sending the calibration mode signal, and then the calibration code is written into the driver of each DQ (output drive circuit 15) and CA CDT (terminal resistance circuit 16) by using the ZQ Latch command, and the on-chip ZQ self-calibration processing is prohibited at the same time, which can implement the purpose of saving power and avoid the deviation introduced by environmental noise to the on-chip ZQ self-calibration.

In addition, the circuit for controlling calibration 10 provided by the embodiments of the present disclosure is also compatible with the conventional ZQ calibration mode. That is, in the normal use process of the user, the memory can be controlled to be in the on-chip calibration mode. At this time, the on-chip calibration circuit 12 performs on-chip ZQ self-calibration process on the memory according to the regulations of JEDEC under the condition limitation of certain changes in temperature, voltage, and time. The second calibration code is written into the driver of each DO (output drive circuit 15) and CA ODT (terminal resistance circuit 16) by using the ZQ Latch command after end of the calibration.

In other words, in order to overcome the disadvantage that the user cannot know or set the ZQ calibration code, the embodiments of the present disclosure provide a circuit for controlling calibration 10, which at least includes the following contents: on the one hand, the ZQ calibration code is controlled by the multiplexer to adopt the first calibration code (off-chip value, set by the user) or the second calibration code (on-chip value, obtained by ZQ self-calibration), so as to adapted to different application scenarios. On the other hand, the read-only register group and the second write-only register group are added, so as it is convenient for the user to read out the candidate calibration code and write the first calibration code. On another hand, the first write-only register is added to allow the user to select the on-chip calibration mode or the off-chip calibration mode, so that the mode switching is implemented quickly and conveniently. In this way, the user is allowed to perform dual-selection of on-chip or off-chip to perform ZQ calibration according to the user's own situations through the circuit for controlling calibration 10 provided by the embodiments of the present disclosure. In a case that the calibration accuracy remains unchanged basically, the current of ZQ calibration is saved greatly, the time of ZQ calibration is saved, the calibration code jump caused by noise in the same situation can be eliminated, thereby reducing power consumption and time consumption, and avoiding the deviation introduced by environmental noise to on-chip ZQ self-calibration.

Based on above, in the embodiments of the present disclosure, a user is allowed to select an on-chip calibration mode or an off-chip calibration mode to determine the ZQ calibration code, so as to implement the best performance in different practical application scenarios. In a case that the external conditions remain unchanged, the user may set the ZQ calibration code through the off-chip calibration mode, and it is not necessary to preform frequent ZQ self-calibration process, which not only reduces power consumption but also saves system time, thereby reducing resource waste and improving data process performance of memory. In addition, the deviation introduced by environmental noise to the ZQ calibration code and the degradation of signal integrity of the memory due to impedance mismatch can be avoided through the off-chip calibration mode.

Figure 4:
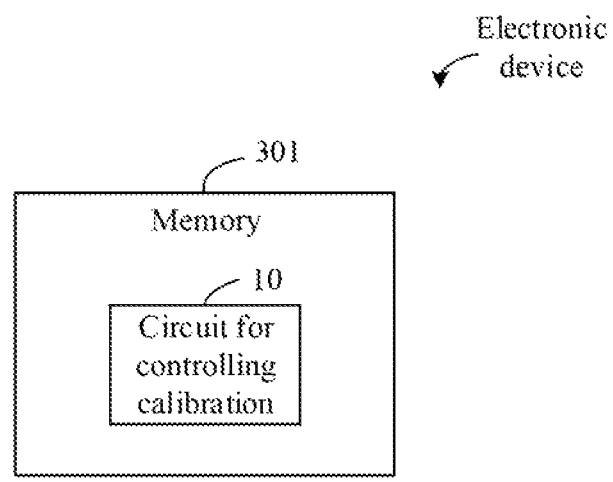
FIG. 4 is a schematic structural diagram of an electronic device provided by some embodiments of the present disclosure.

In yet another embodiment of the present disclosure, referring to FIG. 4, a schematic structural diagram of an electronic device provided by some embodiments of the present disclosure is shown. As shown in FIG. 4, the electronic device includes a memory 301, and the memory 301 includes the aforementioned circuit for controlling calibration 10.

Since the circuit 10 for controlling calibration exists in the electronic device, a user is allowed to select an on-chip calibration mode or an off-chip calibration mode to determine the ZQ calibration code, so as to implement the best performance in different practical application scenarios. In a case that the external conditions remain unchanged, the user may set the ZQ calibration code through the off-chip calibration mode, which can reduce power consumption, save system time, and avoid the deviation introduced by environmental noise to the ZQ calibration code and the degradation of signal integrity of the memory due to impedance mismatch.

Figure 5:
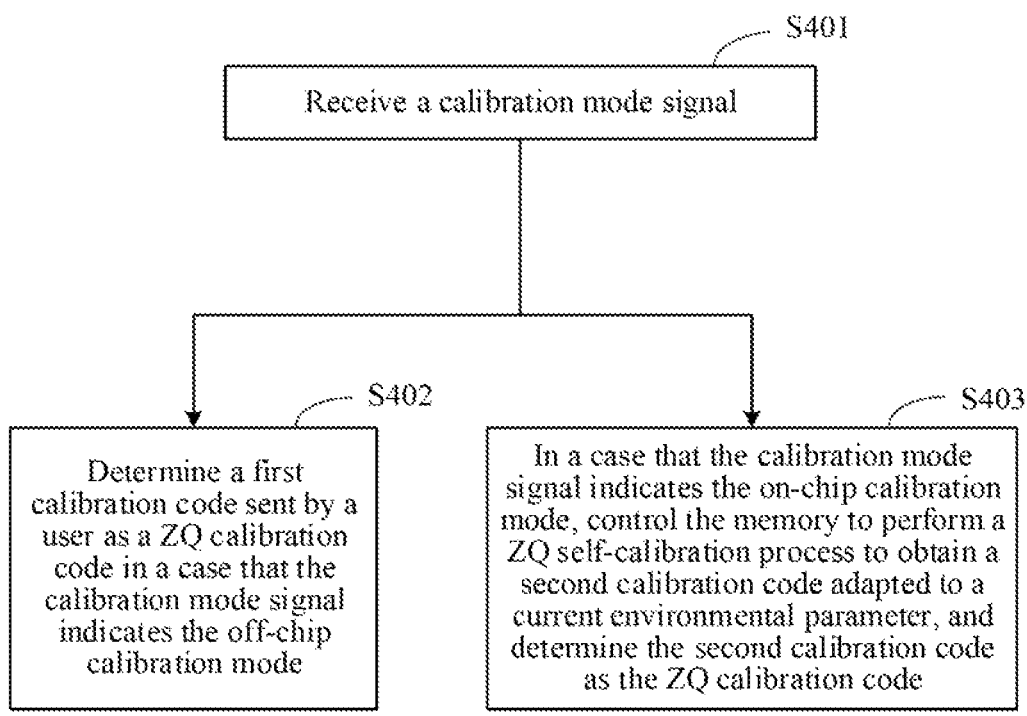
FIG. 5 is a schematic flowchart of a method of controlling calibration provided by some embodiments of the present disclosure.

In some embodiments of the present disclosure, referring to FIG. 5, a schematic flowchart of a method for controlling calibration provided by some embodiments of the present disclosure is shown. As shown in FIG. 5, the method includes the following operations.

In step S401, a calibration mode signal is received.

It should be noted that the method for controlling calibration provided by the embodiments of the present disclosure is applicable for the aforementioned electronic device including the memory 301, and the memory 301 at least includes the circuit for controlling calibration 10. Here, since the memory 301 supports an on-chip calibration mode and an off-chip calibration mode, the user may send a calibration mode signal to select a desired ZQ calibration mode to match different practical application scenarios.

In step S402, a first calibration code sent by a user is determined as a ZQ calibration code in a case that the calibration mode signal indicates the off-chip calibration mode.

In step S403, in a case that the calibration mode signal indicates the on-chip calibration mode, the memory is controlled to perform a ZQ self-calibration process to obtain a second calibration code adapted to a current environmental parameter, and the second calibration code is determined as the ZQ calibration code.

Here, there is no sequence for performing step S402 and step S403.

It should be noted that, in the off-chip calibration mode, the first calibration code sent by the user is used as the ZQ calibration code to implement the impedance calibration of the memory, and in the on-chip calibration mode, the second calibration code obtained after the ZQ self-calibration process is used as the ZQ calibration code, so as to implement impedance calibration of memory. In this way, a user is allowed to select an on-chip calibration mode or an off-chip calibration mode to determine the ZQ calibration code, so as to implement the best performance in different practical application scenarios. In a case that the external conditions remain unchanged, the user may set the ZQ calibration code through the off-chip calibration mode, and the frequent ZQ self-calibration process is not needed, which not only reduces power consumption but also saves system time, thereby reducing resource waste and improving data process performance of memory. In addition, the deviation introduced by environmental noise to the ZQ calibration code and the degradation of signal integrity of the memory due to impedance mismatch can be avoided through the off-chip calibration mode.

In some embodiments, in the case that the calibration mode signal indicates the off-chip calibration mode, the method may further include the following operations.

An enable signal in an inactive state and a selection signal in a first state are determined according to the calibration mode signal. The memory is controlled to stop the ZQ self-calibration process by using the enable signal in the inactive state. The first calibration code is determined as the ZQ calibration code by using the selection signal in the first state.

In some embodiments, in the case that the calibration mode signal indicates the on-chip calibration mode, the method further includes the following operations.

An enable signal in an active state and a selection signal in a second state are determined according to the calibration mode signal. The memory is controlled to perform the ZQ self-calibration process by using the enable signal in the active state. The second calibration code is determined as the ZQ calibration code by using the selection signal in the second state.

It should be noted that the functions and related changes of the enable signal and the selection signal may be understood with reference to the above FIG. 2 and FIG. 3. In this way, two different calibration modes are implemented by introducing the enable signal and the selection signal, i.e., an on-chip calibration mode and an off-chip calibration mode.

In some embodiments, the method further includes the following operations.

A current environmental parameter of the memory is detected. The current environmental parameter is presented to the user, so that the user selects the first calibration code from multiple candidate calibration codes according to a preset mapping relationship.

Here, the preset mapping relationship indicates relationships between multiple environmental parameters and the multiple candidate calibration codes, and each of multiple environmental parameters includes a voltage parameter and/or a temperature parameter.

It should be noted that there are multiple sources for the preset mapping relationship. For example, in one case, a preset mapping relationship is stored in the electronic device. During the normal working process of the electronic device, the user may send corresponding control instructions, and the current environmental parameter of the memory is detected by the electronic device. Then, the current environmental parameter and the preset mapping relationship are presented by the electronic device to the user, so that the user determines the candidate calibration code corresponding to the current environmental parameter, i.e., the first calibration code. In another case, the user records the preset mapping relationship, only the current environmental parameter is needed to be presented by the electronic device to the user, and the user can determine the first calibration code.

In some embodiments, the method further includes the following operations.

In the test mode, the calibration mode signal is controlled to indicate the on-chip calibration mode. The memory is controlled to perform, based on the multiple environmental parameters, the ZQ self-calibration process for multiple times respectively to obtain the multiple candidate calibration codes to establish the preset mapping relationship.

Exemplarily, it is assumed that each environmental parameter includes a voltage parameter and a temperature parameter, during the initialization process of the electronic device, the test mode may be entered automatically, the voltage and temperature of the memory are adjusted by the electronic device, the memory is controlled to perform ZQ self-calibration process, and corresponding candidate calibration code is obtained. The above process is repeated under different temperatures and voltages, and candidate calibration codes corresponding to different environmental parameters may be obtained to establish a preset mapping relationship. In addition, the test may be performed through the cooperation of electronic device and temperature control device. That is, after entering the test mode, the voltage of the memory is adjusted by electronic device to a corresponding predetermined value, and the temperature of the memory is adjusted by the other test device.

It should be noted that, in order to simplify the operation difficulty of the user, some steps performed by the user mentioned in the embodiments of the present disclosure may also be performed by a software program automatically. For example, the first calibration code may be directly determined by the electronic device according to the current environment parameter and the preset mapping relationship. At present, software programs are highly automated, and creative efforts by those skilled in the art are not required for improvements similar to the above. Therefore, they should also be regarded as the protection scope of the embodiments of the present disclosure.

In some embodiments, the method further includes the following operations.

The first calibration code is stored in a case that the calibration mode signal indicates the on-chip calibration mode and the first calibration code sent by the user is received. The first calibration code is determined as the ZQ calibration code after the calibration mode signal is adjusted to indicate the off-chip calibration mode. Optionally, the received first calibration code is determined as the ZQ calibration code directly in a case that the calibration mode signal indicates an off-chip calibration mode and the first calibration code sent by a user is received.

It should be noted that before switching from the on-chip calibration mode to the off-chip calibration mode, the user should send the first calibration code firstly to avoid the impedance mismatch caused by there is no first calibration code or inappropriate first calibration code after the on-chip calibration mode is switched to the off-chip calibration mode. In addition, after the memory is already in the off-chip calibration mode, the user may still send a new first calibration code to update the ZQ calibration code.

In some embodiments, the method further includes the following operation.

A resistance value calibration process is performed on an output drive circuit in the memory and a termination resistance circuit in the memory based on the ZQ calibration code.

The embodiments of the present disclosure provide a method for controlling calibration, which allows a user to select an on-chip calibration mode or an off-chip calibration mode to determine the ZQ calibration code, so as to implement the best performance in different practical application scenarios. In a case that the external conditions remain unchanged, the user may set the ZQ calibration code through the off-chip calibration mode, which can reduce power consumption, save system time, and avoid the deviation introduced by environmental noise to the ZQ calibration code and the degradation of signal integrity of the memory due to impedance mismatch.

The above are only preferred embodiments of the present disclosure, and are not intended to limit the protection scope of the present disclosure. It should be noted that, in the present disclosure, the terms "comprising", "including" or any other variation thereof are intended to encompass non-exclusive inclusion, such that a process, method, object or device comprising a series of elements includes not only those elements, but also other elements not expressly listed or inherent to such a process, method, object or device. Without further limitation, an element qualified by the phrase "comprising a . . . " does not preclude the presence of additional identical elements in a process, method, object or device that includes the element. The above serial numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain a new product embodiment. The features disclosed in several method or device embodiments provided in the present disclosure may be combined arbitrarily without conflict to obtain new method embodiments or device embodiments. The above are only specific embodiments of the present disclosure, but the protection scope of the present disclosure is not limited thereto. Any person skilled in the art who is familiar with the technical tiled can easily think of changes or substitutions within the technical scope disclosed by the present disclosure, which should cover within the scope of protection of the present disclosure. Therefore, the protection scope of the present disclosure should be subject to the protection scope of the claims.

The embodiments of the present disclosure provide a circuit for controlling calibration, an electronic device and a method for controlling calibration, which allow a user to select an on-chip calibration mode or an off-chip calibration mode to determine the ZQ calibration code, so as to implement the best performance in different practical application scenarios. In a case that the external conditions remain unchanged, the user may set the ZQ calibration code through the off-chip calibration mode, which can reduce power consumption, save system time, and avoid the introduction of deviations to the ZQ calibration code by environmental noise and the degradation of the signal integrity of the memory.

What is claimed is:

1. A circuit for controlling calibration, applicable for a memory, comprising:
    an off-chip calibration circuit, configured to receive and store a first calibration code sent by a user;
    an on-chip calibration circuit, configured to receive an enable signal, and perform a ZQ self-calibration process on the memory to obtain a second calibration code adapted to a current environmental parameter in a case that the enable signal is in an active state; and
    a mode switching circuit, configured to receive a calibration mode signal, the first calibration code and the second calibration code, and determine the first calibration code as a ZQ calibration code in the case that the calibration mode signal indicates an off-chip calibration mode, or, determine the second calibration code as the ZQ calibration code in a case that the calibration mode signal indicates an on-chip calibration mode.

2. The circuit for controlling calibration of claim 1, wherein the mode switching circuit comprises a first selection circuit and a second selection circuit; wherein,
    the first selection circuit is configured to receive the calibration mode signal, and output a selection signal in a first state in a case that the calibration mode signal indicates the off-chip calibration mode, or, output a selection signal in a second state in a case that the calibration mode signal indicates the on-chip calibration mode; and
    the second selection circuit is configured to receive the selection signal, and output the first calibration code as the ZQ calibration code in a case that the selection signal is in the first state, or, output the second calibration code as the ZQ calibration code in a case that the selection signal is in the second state.

3. The circuit for controlling calibration of claim 2, wherein,
    the first selection circuit is further configured to output the enable signal in the active state to the on-chip calibration circuit in a case that the calibration mode signal indicates the on-chip calibration mode, or, output the enable signal in an inactive state to the on-chip calibration circuit in a case that the calibration mode signal indicates the off-chip calibration mode.

4. The circuit for controlling calibration of claim 3, wherein the first selection circuit comprises a first write-only register, the second selection circuit comprises a multiplexer, and the off-chip calibration circuit comprises a second write-only register group; wherein,
    an input end of the first write-only register is used for receiving the calibration mode signal, and an input end of the second write-only register group is used for receiving the first calibration code;

an enable end of the on-chip calibration circuit is connected to a first output end of the first write-only register to receive the enable signal;

a control end of the multiplexer is connected to a second output end of the first write-only register to receive the selection signal, a first input end of the multiplexer is connected to an output end of the on-chip calibration circuit to receive the second calibration code, a second input end of the multiplexer is connected to an output end of the second write-only register group to receive the first calibration code, an output end of the multiplexer is used for outputting the ZQ calibration code.

5. The circuit for controlling calibration of claim 4, wherein the circuit for controlling calibration further comprises an acquisition circuit, an input end of the acquisition circuit is connected to an output end of the mode switching circuit; wherein, the on-chip calibration circuit is further configured to perform the ZQ self-calibration process on the memory for multiple times for multiple environmental parameters in a test mode, to obtain multiple candidate calibration codes;

the mode switching circuit is further configured to receive the calibration mode signal indicating the on-chip calibration mode in the test mode, to output the multiple candidate calibration codes; and the acquisition circuit is configured to acquire the multiple candidate calibration codes to establish a preset mapping relationship, wherein the preset mapping relationship indicates relationships between the multiple environmental parameters and the multiple candidate calibration codes, wherein during a working process of the memory, the user selects and obtains the first calibration code from the multiple candidate calibration codes based on the preset mapping relationship and a current environment parameter of the memory.

6. The circuit for controlling calibration of claim 5, wherein the acquisition circuit comprises a read-only register group, and an input end of the read-only register group is connected to the output end of the multiplexer; wherein the read-only register group is configured to acquire an output signal of the multiplexer; and the read-only register group is further configured to receive, in the test mode and after the on-chip calibration circuit performs one time of the ZQ self-calibration process, a read command, and output a corresponding candidate calibration code according to the read command.

7. The circuit for controlling calibration of claim 1, wherein the memory further comprises an output drive circuit and a termination resistance circuit; wherein, the memory is further configured to write the ZQ calibration code into the output drive circuit and the termination resistance circuit to implement a resistance value calibration process of the output drive circuit and the termination resistance circuit.

8. An electronic device comprising a memory, wherein the memory comprises a circuit for controlling calibration, and the circuit for controlling calibration comprises:

an off-chip calibration circuit, configured to receive and store a first calibration code sent by a user;

an on-chip calibration circuit, configured to receive an enable signal, and perform a ZQ self-calibration process on the memory to obtain a second calibration code adapted to a current environmental parameter in a case that the enable signal is in an active state; and a mode switching circuit, configured to receive a calibration mode signal, the first calibration code and the second calibration code, and determine the first calibration code as a ZQ calibration code in the case that the calibration mode signal indicates an off-chip calibration mode, or, determine the second calibration code as the ZQ calibration code in a case that the calibration mode signal indicates an on-chip calibration mode.

9. The electronic device of claim 8, wherein the mode switching circuit comprises a first selection circuit and a second selection circuit; wherein, the first selection circuit is configured to receive the calibration mode signal, and output a selection signal in a first state in a case that the calibration mode signal indicates the off-chip calibration mode, or, output a selection signal in a second state in a case that the calibration mode signal indicates the on-chip calibration mode; and the second selection circuit is configured to receive the selection signal, and output the first calibration code as the ZQ calibration code in a case that the selection signal is in the first state, or, output the second calibration code as the ZQ calibration code in a case that the selection signal is in the second state.

10. The electronic device of claim 9, wherein, the first selection circuit is further configured to output the enable signal in the active state to the on-chip calibration circuit in a case that the calibration mode signal indicates the on-chip calibration mode, or, output the enable signal in an inactive state to the on-chip calibration circuit in a case that the calibration mode signal indicates the off-chip calibration mode.

11. The electronic device of claim 10, wherein the first selection circuit comprises a first write-only register, the second selection circuit comprises a multiplexer, and the off-chip calibration circuit comprises a second write-only register group; wherein, an input end of the first write-only register is used for receiving the calibration mode signal, and an input end of the second write-only register group is used for receiving the first calibration code;

an enable end of the on-chip calibration circuit is connected to a first output end of the first write-only register to receive the enable signal;

a control end of the multiplexer is connected to a second output end of the first write-only register to receive the selection signal, a first input end of the multiplexer is connected to an output end of the on-chip calibration circuit to receive the second calibration code, a second input end of the multiplexer is connected to an output end of the second write-only register group to receive the first calibration code, an output end of the multiplexer is used for outputting the ZQ calibration code.

12. The electronic device of claim 11, wherein the circuit for controlling calibration further comprises an acquisition circuit, an input end of the acquisition circuit is connected to an output end of the mode switching circuit; wherein, the on-chip calibration circuit is further configured to perform the ZQ self-calibration process on the memory for multiple times for multiple environmental parameters in a test mode, to obtain multiple candidate calibration codes;

the mode switching circuit is further configured to receive the calibration mode signal indicating the on-chip calibration mode in the test mode, to output the multiple candidate calibration codes; and the acquisition circuit is configured to acquire the multiple candidate calibration codes to establish a preset mapping relationship, wherein the preset mapping relationship indicates relationships between the multiple environmental parameters and the multiple candidate calibration codes, wherein during a working process of the memory, the user selects and obtains the first calibration code from the multiple candidate calibration codes based on the preset mapping relationship and a current environment parameter of the memory.

13. The electronic device of claim 12, wherein the acquisition circuit comprises a read-only register group, and an input end of the read-only register group is connected to the output end of the multiplexer;

wherein the read-only register group is configured to acquire an output signal of the multiplexer; and the read-only register group is further configured to receive, in the test mode and after the on-chip calibration circuit performs one time of the ZQ self-calibration process, a read command, and output a corresponding candidate calibration code according to the read command.

14. A method for controlling calibration, performed by the circuit for controlling calibration of claim 1 and applicable for an electronic device comprising a memory, comprising:

receiving a calibration mode signal, performed by the mode switching circuit;

in a case that the calibration mode signal indicates the off-chip calibration mode, determining a first calibration code sent by a user, receive and store by the off-chip calibration circuit, as a ZQ calibration code; or, in a case that the calibration mode signal indicates the on-chip calibration mode, controlling the on-chip calibration circuit on the memory to perform a ZQ self-calibration process to obtain a second calibration code adapted to a current environmental parameter, and determining the second calibration code as the ZQ calibration code.

15. The method for controlling calibration of claim 14, wherein, in the case that the calibration mode signal indicates the off-chip calibration mode, the method further comprises:

determining, according to the calibration mode signal, an enable signal in an inactive state and a selection signal in a first state;

controlling, by using the enable signal in the inactive state, the memory to stop the ZQ self-calibration process; and determining, by using the selection signal in the first state, the first calibration code as the ZQ calibration code.

16. The method for controlling calibration of claim 14, wherein, in the case that the calibration mode signal indicates the on-chip calibration mode, the method further comprises:

determining, according to the calibration mode signal, an enable signal in an active state and a selection signal in a second state;

controlling, by using the enable signal in the active state, the memory to perform the ZQ self-calibration process; and determining, by using the selection signal in the second state, the second calibration code as the ZQ calibration code.

17. The method for controlling calibration of claim 14, further comprising:

detecting a current environmental parameter of the memory; and presenting the current environmental parameter to the user, so that the user selects the first calibration code from multiple candidate calibration codes according to a preset mapping relationship, wherein the preset mapping relationship indicates relationships between multiple environmental parameters and the multiple candidate calibration codes, and each environmental parameter comprises a voltage parameter and/or a temperature parameter.

18. The method for controlling calibration of claim 17, further comprising:

controlling, in the test mode, the calibration mode signal to indicate the on-chip calibration mode; and controlling, based on the multiple environmental parameters, the memory to perform the ZQ self-calibration process for multiple times respectively to obtain the multiple candidate calibration codes to establish the preset mapping relationship.

19. The method for controlling calibration of claim 14, further comprising:

storing the first calibration code in a case that the calibration mode signal indicates the on-chip calibration mode and the first calibration code sent by the user is received; and determining the first calibration code as the ZQ calibration code after the calibration mode signal is adjusted to indicate the off-chip calibration mode; or, determining the received first calibration code as the ZQ calibration code directly in a case that the calibration mode signal indicates an off-chip calibration mode and the first calibration code sent by a user is received.

20. The method for controlling calibration of claim 14, further comprising:

performing, based on the ZQ calibration code, a resistance value calibration process on an output drive circuit in the memory and a termination resistance circuit in the memory.

* * * * *